US008455310B2

(12) United States Patent
Yim

(10) Patent No.: US 8,455,310 B2
(45) Date of Patent: Jun. 4, 2013

(54) METHODS OF MANUFACTURING THIN FILM TRANSISTOR DEVICES

(75) Inventor: Dong-Kil Yim, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/539,350

(22) Filed: Jun. 30, 2012

(65) Prior Publication Data

US 2013/0017648 A1    Jan. 17, 2013

Related U.S. Application Data

(60) Provisional application No. 61/507,311, filed on Jul. 13, 2011.

(51) Int. Cl.
*H01L 21/00* (2006.01)

(52) U.S. Cl.
USPC ............... 438/151; 438/104; 438/149

(58) Field of Classification Search
USPC .............. 438/104, 149, 151, 164, 165, 300
See application file for complete search history.

(56) References Cited

U.S. PATENT DOCUMENTS

| 5,294,811 | A | 3/1994 | Aoyama et al. |
|---|---|---|---|
| 5,942,050 | A | 8/1999 | Green et al. |
| 6,190,932 | B1 | 2/2001 | Yoshimi et al. |
| 6,200,825 | B1 | 3/2001 | Yoshimi et al. |
| 6,265,288 | B1 | 7/2001 | Okamoto et al. |
| 6,297,443 | B1 | 10/2001 | Nakajima et al. |
| 6,309,906 | B1 | 10/2001 | Meier et al. |
| 6,326,304 | B1 | 12/2001 | Yoshimi et al. |
| 6,337,224 | B1 | 1/2002 | Okamoto et al. |
| 6,566,159 | B2 | 5/2003 | Sawada et al. |
| 6,605,494 | B1 * | 8/2003 | Park et al. ............ 438/149 |
| 6,989,553 | B2 | 1/2006 | Yokogawa et al. |
| 7,074,641 | B2 | 7/2006 | Kondo et al. |
| 7,314,526 | B1 | 1/2008 | Preti et al. |
| 2002/0033191 | A1 | 3/2002 | Kondo et al. |
| 2004/0082097 | A1 | 4/2004 | Lohmeyer et al. |
| 2004/0238851 | A1 | 12/2004 | Flores et al. |
| 2005/0251990 | A1 | 11/2005 | Choi et al. |
| 2006/0060138 | A1 | 3/2006 | Keller et al. |

(Continued)

FOREIGN PATENT DOCUMENTS

| EP | 0994515 A2 | 4/2000 |
|---|---|---|
| JP | 2007-262541 A | 10/2007 |
| KR | 2006-0077554 A | 7/2006 |
| WO | WO-2009018509 A1 | 2/2009 |

OTHER PUBLICATIONS

PCT international search report and written opinion of PCT/US2012/045053 dated Dec. 20, 2012.

*Primary Examiner* — Kevin M Picardat
(74) *Attorney, Agent, or Firm* — Patterson & Sheridan, LLP

(57) ABSTRACT

Embodiments of the disclosure provide methods of fabricating a thin film transistor device with good profile control of peripheral sidewall of an active layer formed in the thin film transistor devices. In one embodiment, a method for manufacturing a thin film transistor device includes providing a substrate having a source-drain metal electrode layer disposed on an active layer formed thereon, wherein the active layer is a metal oxide layer, performing a back-channel-etching process to form a channel in the source-drain metal electrode layer, and performing an active layer patterning process after the back-channel-etching process.

19 Claims, 4 Drawing Sheets

U.S. PATENT DOCUMENTS

| | | |
|---|---|---|
| 2006/0127817 A1* | 6/2006 | Ramanujan et al. .......... 430/320 |
| 2006/0240630 A1 | 10/2006 | Bauer et al. |
| 2006/0258064 A1* | 11/2006 | Chen et al. .................... 438/149 |
| 2007/0039942 A1 | 2/2007 | Leung et al. |
| 2007/0298590 A1 | 12/2007 | Choi et al. |
| 2010/0001272 A1 | 1/2010 | Ye |
| 2010/0163863 A1 | 7/2010 | Yaegashi |
| 2010/0176399 A1 | 7/2010 | Takeguchi |

* cited by examiner

METHODS OF MANUFACTURING THIN FILM TRANSISTOR DEVICES

CROSS-REFERENCE TO RELATED APPLICATION

This application claims benefit of U.S. Provisional Patent Application No. 61/507,311, filed on Jul. 13, 2011, which is incorporated by reference in its entirety.

BACKGROUND OF THE INVENTION

1. Field of the Invention

Embodiments of the present invention generally relate to methods for forming device structures for thin film transistor applications. More particularly, this invention relates to methods and sequences for forming device structures for thin film transistor applications.

2. Description of the Related Art

Plasma display panels, active matrix liquid crystal displays (AMLCD) or active matrix organic light emitting diodes (AMOLED) and liquid crystal displays are frequently used for flat panel displays. Liquid crystal displays (LCD) generally contain two transparent substrates joined together with a layer of a liquid crystal material sandwiched therebetween. The transparent substrate may be a semiconductor substrate, glass, quartz, sapphire, flexible or a clear plastic film. The LCD may also contain light emitting diodes for back lighting.

As the resolution requirements for liquid crystal displays increase, it has become desirable to control a large number of separate areas of the liquid crystal cell, called pixels. In a modern display panel, more than 1,000,000 pixels may be present. At least the same number of transistors is formed on the glass substrate so that each pixel can be switched between an energized and de-energized state relative to the other pixels disposed on the substrate.

FIG. 1 depicts a sequence of manufacturing a conventional thin film transistor device. FIGS. 2A-2D depicts the conventional thin film transistor device at different manufacture stages manufactured by the sequence depicted in FIG. 1. Generally, the thin film transistor device 200 is disposed on a substrate 202, as depicted in FIG. 2A. A gate electrode 204 is formed and patterned on the substrate 202 followed by a gate insulator layer 206. An active layer 208 is formed on the gate insulator layer 206. The active layer 208 is often selected from a transparent metallic oxide material that has high electron mobility as well as low temperature manufacture process requirements to allow the use of flexible substrate materials, such as plastic materials, to be processed at low temperatures to avoid substrate damage. After formation of the active layer 208, an etching stop layer 210 is formed on the active layer 208. Subsequently, a source-drain metal electrode layer 214 is then disposed thereon to form the thin film transistor device 200 having a region 218 exposed through a patterned photoresist layer 216 to form a channel therein during the subsequent etching and patterning processes.

Referring back to FIG. 1, after the device structure 200 is formed on the substrate 202, at step 102, the substrate 202 is then transferred to a metal active layer patterning tool to perform a metal active layer patterning process to remove unprotected regions 230 of the active layer 208 from the device structure 200 to expose exposing regions 226 of the underlying gate insulator layer 206, as shown in FIG. 2B. It is noted that the unprotected regions 230 of the active layer 208 may or may not be damaged by the previous process, as shown as an uneven surface in FIG. 2A. After the metal active layer patterning process, at step 104, a back-channel-etching (BCE) process is performed to etch the source-drain metal electrode layer 214 to form a channel 228 in the thin film transistor device 200 until an upper surface 220 of the underlying etch stop layer 210 is exposed, as shown in FIG. 2C. During the back-channel-etching (BCE) process, the aggressive etchants utilized during the etching process may adversely etch and attack the underlying active layer 208 of the device 200, resulting in damage and undesired edge profile 222 in the active layer 208, thereby deteriorating film quality and electric performance of the thin film transistor device 200. At step 106, the substrate 202 is then transferred to a photoresist layer removal processing tool to remove the photoresist layer 216, as shown in FIG. 2D. During the photoresist layer removal process, the edge 222 of the active layer 208 may be further damaged or attacked during the subsequent process along with other passivation and patterning process performed at step 108 to complete the device manufacture process, thereby adversely deteriorating film quality of the active layer 208 and leading to device failure.

Therefore, there is a need for a method for manufacturing the thin film transistor devices having improved electrical performance and stability.

SUMMARY OF THE INVENTION

Embodiments of the disclosure provide methods of fabricating a thin film transistor device with good profile control of an active layer formed in the thin film transistor devices. In one embodiment, a method for manufacturing a thin film transistor device includes providing a substrate having a source-drain metal electrode layer disposed on an active layer, wherein the active layer is a metal oxide layer, performing a back-channel-etching process to form a channel in the source-drain metal electrode layer, and performing an active layer patterning process after the back-channel-etching process.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure provide methods of fabricating a thin film transistor device with good profile control of periphery sidewalls of an active island layer formed in the thin film transistor devices. In one embodiment, the methods for maintaining good profile control of an active layer are to be used in a TFT device, photodiodes, semiconductor diode, light-emitting diode (LED), or organic light-emitting diode (OLED), or other suitable display applications. The good profile control of an active layer formed in a thin film transistor device advantageously provides efficient electrical performance of transistor and diode devices while protecting the device structure from damage as compared to conventional techniques that etch the active layer prior to etching a metal electrode layer thereby exposing the sidewalls to the metal electrode layer etchants. Loss of peripheral sidewall control of an active layer and damage from etching results in diminished electrical performance in conventional devices.

Figure 1:
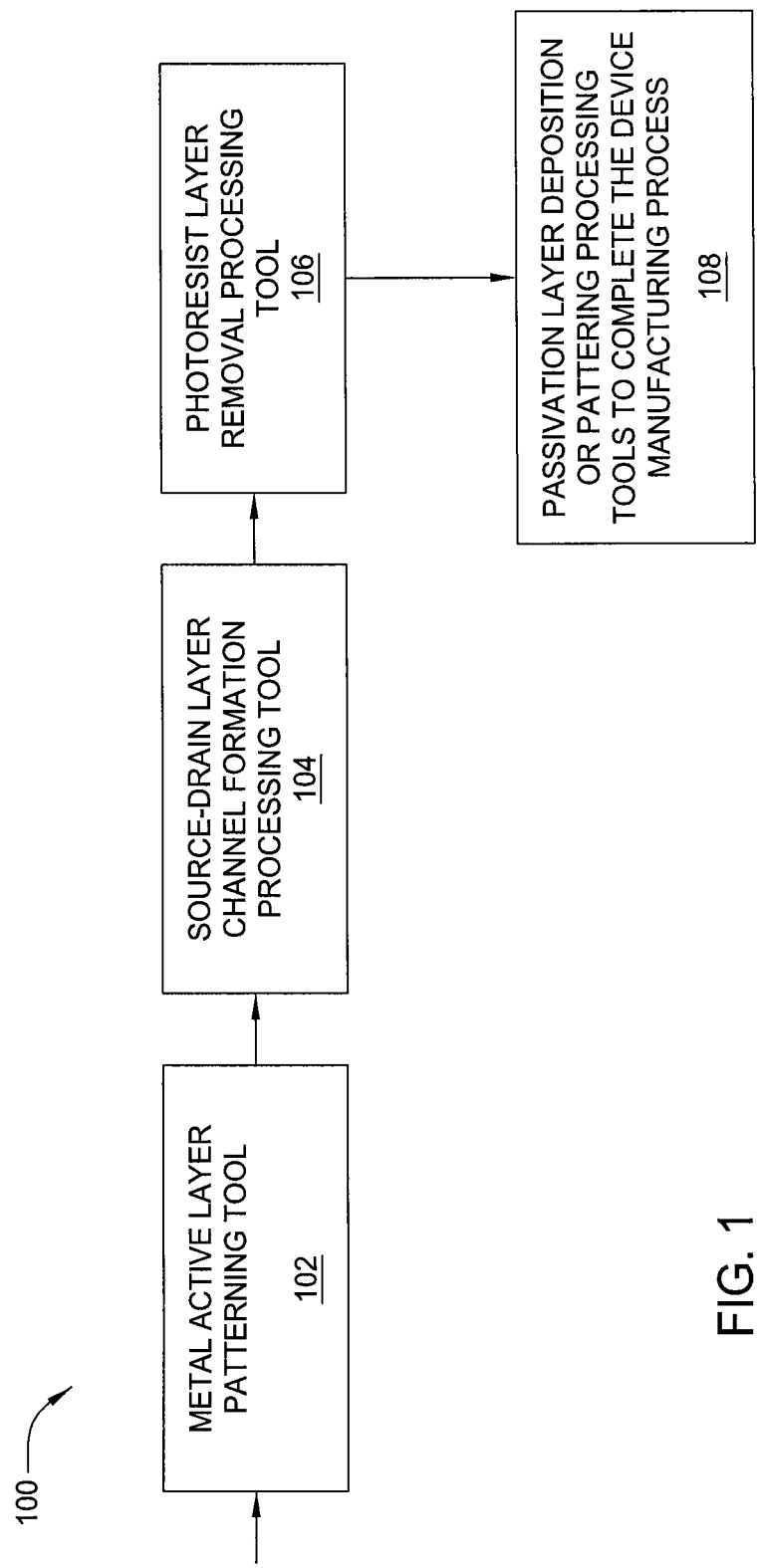
FIG. 1 depicts a sequence of fabrication of a device structure as conventionally performed.
Figures 2A, 2B, 2C, 2D:
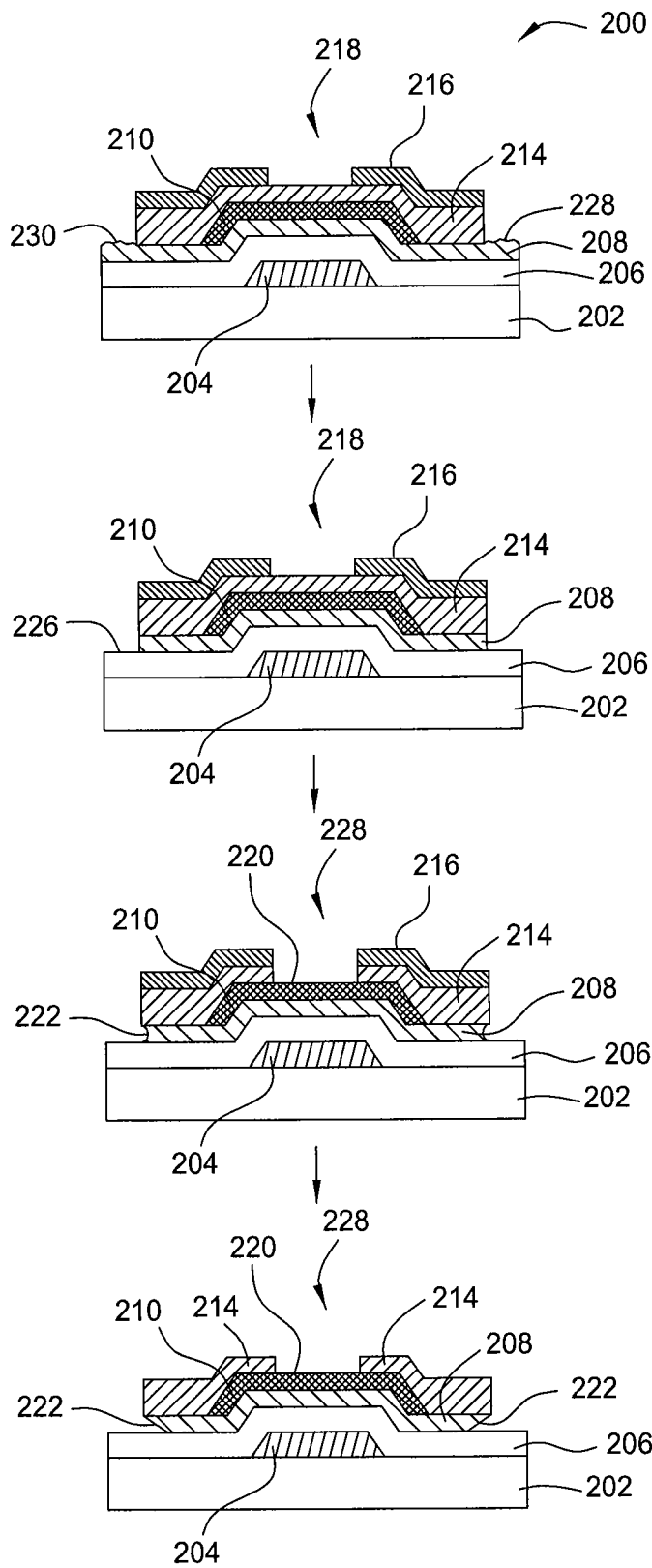
FIGS. 2A-2D are sectional views of a conventional thin film transistor device structure according to the conventional fabrication of FIG. 1.
Figure 3:
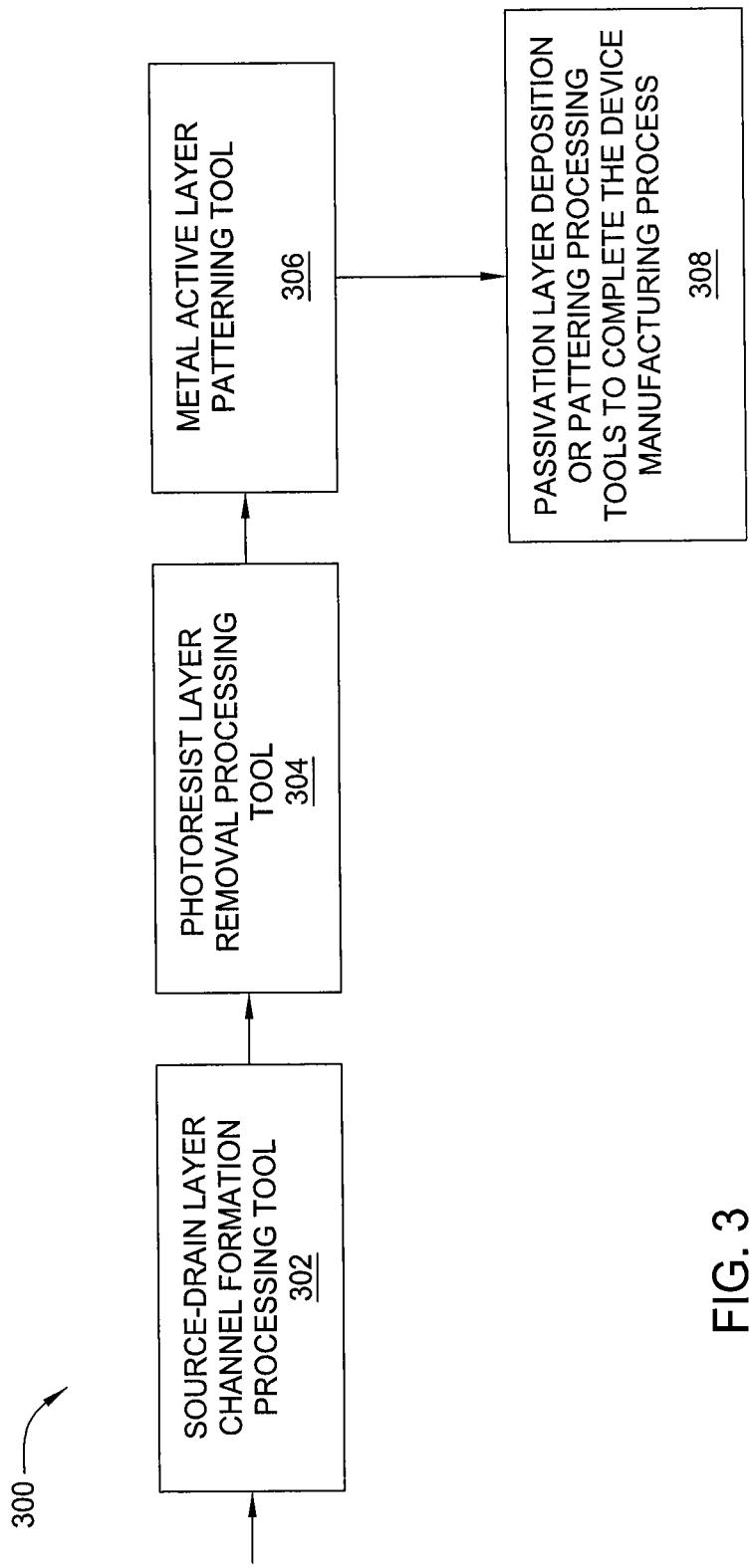
FIG. 3 depicts a sequence of fabrication of a device structure in accordance with one embodiment of the present disclosure.
Figures 4A, 4B, 4C, 4D:
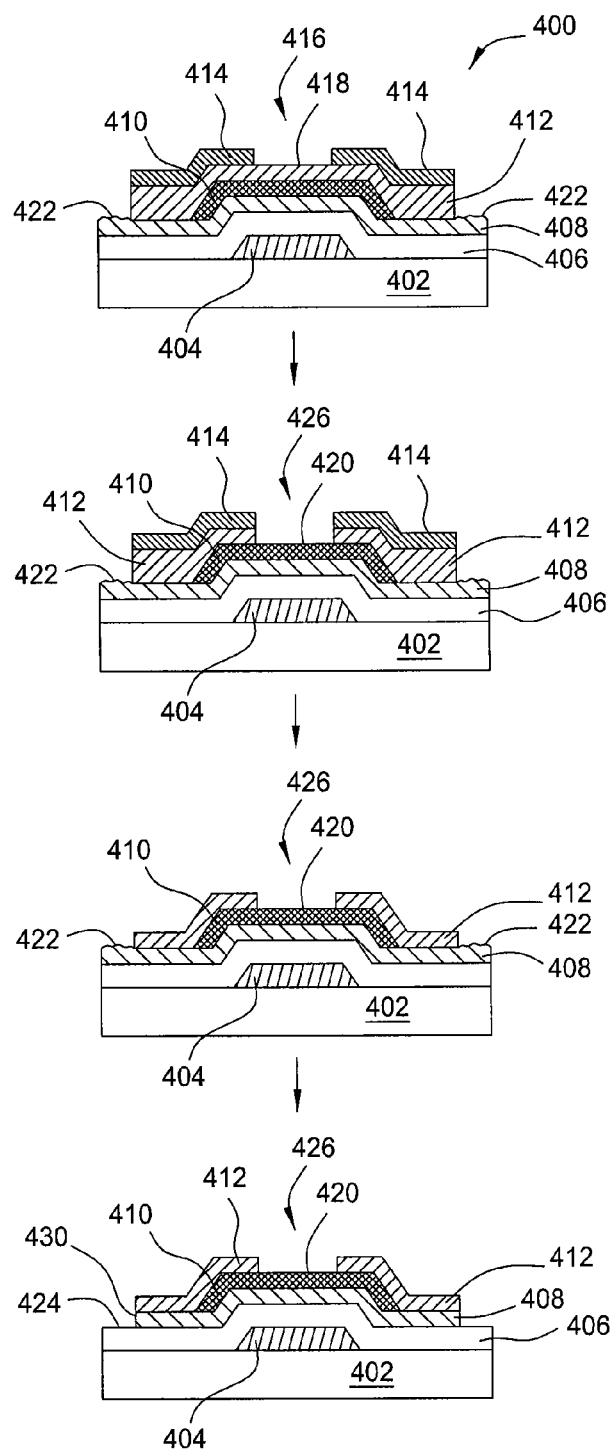
FIGS. 4A-4D are sectional views of a thin film transistor device structure according to the sequence depicted in FIG. 3.

FIG. 3 depicts a sequence of manufacturing a thin film transistor device in accordance with one embodiment of the present disclosure. FIGS. 4A-4D depict a thin film transistor device at different manufacture stages manufactured by the sequence depicted in FIG. 3. As shown in FIG. 4A, the thin film transistor device 400 is disposed on a substrate 402 having a gate electrode layer 404, a gate insulator layer 406 and an active layer 408 consecutively formed thereon. It is noted that the substrate 402 may have different combination of films, structures or layers previously formed thereon to facilitate forming different device structures on the substrate 402. In one embodiment, the substrate 402 may be any one of glass substrate, plastic substrate, polymer substrate, metal substrate, singled substrate, roll-to-roll substrate, or other suitable transparent substrate suitable for forming a thin film transistor thereon. In one embodiment, the gate electrode layer 404 may be fabricated from any suitable metallic material, such as indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), or combination thereof. The gate insulating layer 406 may be fabricated from silicon oxide ($SiO_2$), TEOS, silicon oxynitride (SiON), silicon nitride (SiN) and the like. Furthermore, the active layer 408 may be fabricated from a metal oxide material, such as InGaZnO, InGaZnON, ZnO, ZnON, ZnSnO, CdSnO, GaSnO, TiSnO, CuAlO, SrCuO, LaCuOS, GaN, InGaN, AlGaN or InGaAlN, among others. In one particular embodiment, the active layer 408 is fabricated from InGaZnO. It is noted that exposed portions 422 of the active layer 408 unprotected by the device 400 may or may not be damaged having an uneven surface (as shown in FIGS. 4A-4C) from previous manufacture processes.

Subsequently, an etching stop layer 410 is formed on the active layer 408. The etching stop layer 410 may be a dielectric layer, a dielectric layer containing metal, a metal layer, or other suitable materials. In one embodiment, the etching stop layer 410 may be fabricated from a material selected from a group consisting of titanium (Ti) containing material, tantalum (Ta) containing material, silicon containing material, zinc containing materials, hafnium (Hf) containing materials, and other suitable dielectric materials. In one exemplary embodiment, the etching stop layer 410 is a $TiO_2$ or $Ta_2O_5$ layer. A source-drain metal electrode layer 412 may be deposited on the etching stop layer 410. The source-drain metal electrode layer 412 may be fabricated by a conductive material that may be patterned to define source and drain contacts of the transistor device 400. In one embodiment, the source-drain metal electrode layer 412 is line patterned with a lithography process. In one embodiment, the source-drain metal electrode layer 412 may be fabricated by a material selected from a group consisting of copper (Cu), gold (Au), silver (Ag), aluminum (Al), tungsten (W), molybdenum (Mo), chromium (Cr), tantalum (Ta), titanium (Ti), alloys thereof and combinations thereof. In an exemplary embodiment, the source-drain metal electrode layer 412 is a molybdenum (Mo) layer or a titanium (Ti) layer. A patterned photoresist layer 414 is formed on the source-drain metal electrode layer 412 to form an opening 416 exposing a surface 418 of the source-drain metal electrode layer 412 for etching.

Referring back to FIG. 3, at step 302, the substrate 402 is transferred to a processing tool to perform a back-channel-etching (BCE) process to etch the source-drain metal electrode layer 412 to form a channel 426 in the thin film transistor device 400 until an upper surface 420 of the underlying etching stop layer 410 is exposed, as shown in FIG. 4B. The back-channel-etching (BCE) process may be any suitable etching processes, including dry etching, wet etching, ion plasma etching, or the like, which can form the channel 426 in the source-drain metal electrode layer 412. The back-channel-etching (BCE) process is performed on the source-drain metal electrode layer 412 until the upper surface 420 of the etching stop layer 410 is exposed through the channel 426 to complete the back-channel-etching (BCE) process.

In one embodiment, where the BCE process is a dry etching process, the source-drain metal electrode layer 412 is a chromium (Cr) containing metal and the chemical used to dry etch the source-drain metal electrode layer 412 is a chlorine (Cl) containing gas. The chlorine containing gas may include, but is not limited to, $Cl_2$, boron trichloride ($BCl_3$) or the like. In another embodiment, the source-drain metal electrode layer 412 is a molybdenum (Mo) containing metal and the chemical used to dry etch the source-drain metal electrode layer 412 is a fluorine (F) containing gas. The fluorine containing gas may include, but is not limited to, $SF_6$, $CF_4$, $C_2F_2$, or the like.

In one embodiment, where the BCE process is a wet etching process, the source-drain metal electrode layer 412 is a molybdenum (Mo) containing metal and the chemical used to wet etch the source-drain metal electrode layer 412 may include, but is not limited to, $H_2O_2$, $H_2O_2$/KOH, or the like.

At step 304, after the channel 426 is formed in the source-drain metal electrode layer 412 exposing the underlying etching stop layer 410, the substrate 402 may be further transferred to a photoresist layer removal processing tool to perform an ash process to remove the photoresist layer 414 from the substrate 402, as shown in FIG. 4C. Alternatively, in the embodiment wherein the photoresist layer 414 is consumed and substantially etched away during the back-channel-etching (BCE) performed at step 302, the ashing process at step 304 may be eliminated to save manufacture cost.

At step 306, the substrate 402 is then transferred to a metal active layer patterning tool to perform a metal active layer patterning process to unprotected regions (e.g., the exposed portions 422) of the active layer 408 from the structure of the transistor device 400 to expose regions 424 of the underlying gate insulator layer 406, as shown in FIG. 4D. After the active layer 408 is etched, exposing the regions 424 of the underlying gate insulator layer 406, an edge 430 of the active layer 408 is defined having a desired profile/pattern. Unlike the conventional practice of performing a metal active layer etching process prior to the back-channel-etching (BCE) process, the active layer 408 is not etched until the channel 426 has been formed in the source-drain metal electrode layer 412. By doing so, the edge 430 of the active layer 408 exposed after the active layer patterning process cannot be attacked by plasma damage of aggressive etchants during the back-channel-etching (BCE) process and/or the photoresist layer removal process as found in conventional fabrication sequences. By performing the active layer etching process after the channel 426 is formed and completed in the source-drain metal electrode layer 412 (e.g., after a back-channel-etching process), a good control of the active layer 408 may be maintained, thereby resulting in an edge 430 having substantially good control without forming damage to the active layer 408, which may diminish electrical performance of the device 400. For example, the resistance of the device to humidity is improved by about 268 percent.

In one embodiment, the active layer etching process may be a wet etching process performed by immersing the substrate 402 is a tank or wet bench having etching solution disposed therein. In one embodiment, the chemical used to wet etch the active layer 408 is an acid. The acid may include, but is not limited to, nitric acid, sulfuric acid, or the like. In one particular embodiment, the chemical used to wet etch the active layer 408 is a HCl containing solution having a concentration between about 0.1 percent by volume and about 5 percent by volume. It is noted that the active layer patterning process may also be performed by a dry etching process, or any type of suitable patterning process.

After the active layer patterning process, the device 400 formed on the substrate 402 may be further processed at step 308 to form passivation layers or so on to complete the device manufacture process. It is noted that additional process steps may be performed in any of the step, such as from step 302 to step 308, as desired, to facilitate forming the device structure on the substrate. For example, additional process steps, such as additional annealing, etching, depositing and cleaning, may be performed as needed to assist transferring features between any of the steps described in process 300 as needed.

Thus, the methods described herein advantageously improve the electronic performance, film layer profile and stability of electric devices by performing an active layer patterning process after a back-channel-etching (BCE) process on a thin-film transistor device. In this manner, the sidewalls of the active layer have improved profile control, and better substrate to substrate repeatability, along with reduced damage due since the sidewalls of the active layer are no longer exposed to etchants used to etch the metal electrode layer.

While the foregoing is directed to embodiments of the present invention, other and further embodiments of the invention may be devised without departing from the basic scope thereof, and the scope thereof is determined by the claims that follow.

What is claimed is:

1. A method for manufacturing a thin film transistor device comprising:
    providing a substrate having a source-drain metal electrode layer disposed on an active layer formed thereon, wherein the active layer is a metal oxide layer;
    performing a back-channel-etching process to form a channel in the source-drain metal electrode layer; and
    performing an active layer patterning process after the back-channel-etching process.

2. The method of claim 1, wherein the substrate further comprises an etching stop layer disposed between the source-drain metal electrode layer and the active layer.

3. The method of claim 2, wherein the back-channel-etching process is performed to etch the source-drain metal electrode layer until the etching stop layer is exposed.

4. The method of claim 2, wherein the etching stop layer is a Si containing layer, a Zn containing layer, a Hf containing layer, a Ti containing layer or a Ta containing layer.

5. The method of claim 1, wherein the active layer is fabricated from a material selected from a group consisting of InGaZnO, InGaZnON, ZnO, ZnON, ZnSnO, CdSnO, GaSnO, TiSnO, CuAlO, SrCuO, LaCuOS, GaN, InGaN, AlGaN and InGaAlN.

6. The method of claim 1, wherein the back-channel-etching process is a dry etch process.

7. The method of claim 6, wherein the dry etch process further comprises:
    exposing the source-drain metal electrode layer to a chlorine containing gas, wherein the source-drain metal electrode layer is a chromium containing metal.

8. The method of claim 6, wherein the dry etch process further comprises:
    exposing the source-drain metal electrode layer to a fluorine containing gas, wherein the source-drain metal electrode layer is a molybdenum containing metal.

9. The method of claim 1, wherein the back-channel-etching process is a wet etch process.

10. The method of claim 9, wherein the wet etch process further comprises:
    exposing the source-drain metal electrode layer to at least one of $H_2O_2$ and $H_2O_2$/KOH.

11. The method of claim 10, wherein the source-drain metal electrode layer is a molybdenum containing metal.

12. The method of claim 1, wherein the active layer patterning process is a dry etching process.

13. The method of claim 1, wherein the active layer patterning process is a wet etching process using an acid solution.

14. The method of claim 13, wherein the acid solution includes nitric acid or sulfuric acid.

15. The method of claim 1, wherein the active layer patterning process is a wet etching process using an HCl containing solution.

16. The method of claim 15, wherein the HCl containing solution has a concentration between about 0.1 percent by volume and about 5 percent by volume.

17. The method of claim 1, wherein the source-drain metal electrode layer is fabricated from a material selected from a group consisting of Cu, Au, Ag, Al, W, Mo, Cr, Ta, Ti, alloys or combinations thereof.

18. The method of claim 1, wherein a patterned photoresist layer is formed on the source-drain metal electrode layer.

19. The method of claim 18, further comprising:
    performing an ash process to remove the patterned photoresist layer.

* * * * *